(12) United States Patent
Zuniga

(10) Patent No.: US 8,526,211 B1
(45) Date of Patent: *Sep. 3, 2013

(54) MEMORY PROGRAM CIRCUIT

(75) Inventor: Marco A. Zuniga, Palo Alto, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/561,867

(22) Filed: Jul. 30, 2012

Related U.S. Application Data

(63) Continuation of application No. 12/751,764, filed on Mar. 31, 2010, now Pat. No. 8,233,306.

(51) Int. Cl.
*G11C 17/00* (2006.01)
(52) U.S. Cl.
USPC .......................................................... 365/104
(58) Field of Classification Search
USPC .......................................................... 365/104
See application file for complete search history.

(56) References Cited

U.S. PATENT DOCUMENTS

| | | | |
|---|---|---|---|
| 7,239,558 B1 * | 7/2007 | Poplevine et al. | 365/188 |
| 7,724,600 B1 | 5/2010 | Im et al. | |
| 8,233,306 B1 * | 7/2012 | Zuniga | 365/104 |
| 2004/0062072 A1 * | 4/2004 | Tanzawa | 365/145 |

* cited by examiner

*Primary Examiner* — Hoai V Ho
*Assistant Examiner* — Pablo Huerta
(74) *Attorney, Agent, or Firm* — Fish & Richardson P.C.

(57) ABSTRACT

Methods, systems, and apparatus, including computer program products for programming memory. In one aspect, a program circuit includes a first transistive element; a second transistive element coupled to a first end of the first transistive element; a burn subcircuit, the burn subcircuit including a third transistive element coupled to a fourth transistive element, where the drain of the third transistive element is coupled to a second end of the first transistive element, and the source of the third transistive element is coupled to the drain of the fourth transistive element; and a fifth transistive element coupled in parallel to the fourth transistive element. Control logic coupled to the first transistive element, the burn subcircuit, and the fourth transistive element selectively enables the second transistive element, selectively enables the fourth transistive element, and selectively enables the fifth transistive element to enable a read mode or a program mode.

15 Claims, 2 Drawing Sheets

MEMORY PROGRAM CIRCUIT

CROSS-REFERENCE TO RELATED APPLICATIONS

This application is a continuation application of and claims priority to U.S. application Ser. No. 12/751,764, filed on Mar. 31, 2010, the entire disclosure of which is incorporated by reference.

BACKGROUND

This specification relates to programming memory.

A value of a bit can be stored in a memory cell (a bit-cell) of a memory. The memory can be volatile or non-volatile. One type of non-volatile memory is a one time programmable (OTP) memory. OTP memory is a memory that is typically programmed only once. In practice, some OTP memories rely on breakdown of a device, e.g., a fuse, in a program circuit to change the value of the bit. As a result, programming of an OTP memory is not typically changed by an end user.

In practice, some OTP memories have memory cells and program circuits fabricated on a single integrated circuit (IC). OTP memory can be used in integrated circuits that require high operating voltages, e.g., voltages greater than about 12 V. In such applications, high-voltage devices, e.g., high-voltage transistors, are typically required to construct the program circuits which must be able to withstand the high operating voltages. The use of high-voltage devices increases the cost of fabricating the OTP memory.

SUMMARY

This specification describes technologies relating to a memory program circuit, particularly to a one-time programmable (OTP) bit-cell program circuit.

In general, one aspect of the subject matter described in this specification can be embodied in a semiconductor device that includes a first low-voltage transistive element; a second high-voltage transistive element coupled to a first end of the first low-voltage transistive element; a burn subcircuit coupled to the first low-voltage transistive element and a latch, the burn subcircuit including a third high-voltage transistive element coupled to a fourth low-voltage transistive element, where the drain of the third high-voltage transistive element is coupled to the a second end of the first low-voltage transistive element, and the drain of the fourth low-voltage transistive element is coupled to the latch; and a fifth low-voltage transistive element coupled in parallel to the fourth low-voltage transistive element. Control logic coupled to the burn subcircuit enables a voltage divider comprising the first low-voltage transistive element, the third high-voltage transistive element, and the fifth low-voltage transistive element, in a read mode; or enables the third high-voltage transistive element and the fourth low-voltage transistive element, and burns the first low-voltage transistive element, in a program mode. Other embodiments of this aspect include corresponding systems, methods, and computer program products.

These and other embodiments can optionally include one or more of the following features. One or more of the transistive elements can be stepped gate laterally diffused metal oxide semiconductor (LDMOS) transistors.

In general, another aspect of the subject matter described in this specification can be embodied in a program circuit that includes a first transistive element; a second transistive element coupled to a first end of the first transistive element; a burn subcircuit, the burn subcircuit including a third transistive element coupled to a fourth transistive element, where the drain of the third transistive element is coupled to a second end of the first transistive element, and the source of the third transistive element is coupled to the drain of the fourth transistive element; and a fifth transistive element coupled in parallel to the fourth transistive element. Control logic coupled to the first transistive element, the burn subcircuit, and the fourth transistive element selectively enables the second transistive element, selectively enables the fourth transistive element, and selectively enables the fifth transistive element to enable a read mode or a program mode. Other embodiments of this aspect include corresponding systems, methods, and computer program products.

These and other embodiments can optionally include one or more of the following features. The circuit further may include a leakage device coupled in parallel with the first transistive element and configured to enhance time dependent dielectric breakdown reliability (TDDB) reliability of the first transistive element.

The first transistive element may be a low-voltage stepped gate capacitor, the second transistive element may be a high-voltage diode, the third transistive element may be a high-voltage stepped gate laterally diffused metal oxide semiconductor (LDMOS) transistor, the fourth transistive element may be a low-voltage transistor, and the fifth transistive element may be a low-voltage transistor. The breakdown voltage of the gate oxide in a stepped gate LDMOS transistor may be less than the breakdown voltage of the junction in the stepped gate LDMOS transistor. The gate oxide in a stepped gate LDMOS may include a first portion and a second portion, where a thickness of the second portion is less than a thickness of the first portion. The thickness of the second portion may be less than about 40 Å. The thickness of the first portion may be greater than about 200 Å. An impedance of the first transistive element may be between 1 kΩ and 10 kΩ. An impedance of the fourth transistive element may be between 10 kΩ and 100 kΩ.

The fourth transistive element and the fifth transistive element may each include a channel of a same type of semiconductor material. The type of semiconductor material may be n-type. The fifth transistive element may be a weak transistor that is configured to create a voltage divider in the read mode. The circuit further may include a latch coupled to the source of the second transistive element.

In general, another aspect of the subject matter described in this specification can be embodied in methods that include the actions of applying a first voltage signal to a first low-voltage transistive element, where the first voltage signal is greater than a breakdown voltage of the first low-voltage transistive element, and where a first end of the first low-voltage transistive element is coupled to a second high-voltage transistive element; applying a second voltage signal to enable a third high-voltage transistive element, where the drain of the third high-voltage transistive element is coupled to a second end of the first low-voltage transistive element; and applying a third voltage signal to enable a fourth low-voltage transistive element, where the fourth low-voltage transistive element is coupled to the third low-voltage transistive element, the drain of the fourth low-voltage transistive element is coupled to a latch, and the fourth low-voltage transistive element is coupled in parallel to a fifth low-voltage transistive element. Other embodiments of this aspect include corresponding systems, apparatus, and computer program products.

In general, another aspect of the subject matter described in this specification can be embodied in methods that include the actions of applying a first voltage signal to a first low-voltage transistive element, where a first end of the first low-voltage transistive element is coupled to a second high-voltage transistive element; applying a second voltage signal to enable a third high-voltage transistive element, where the drain of the third high-voltage transistive element is coupled to a second end of the first low-voltage transistive element, the third high-voltage transistive element is coupled to a fourth low-voltage transistive element, and the drain of the fourth low-voltage transistive element is coupled to a latch; and applying a third voltage signal to enable a fifth low-voltage transistive element and to enable a voltage divider comprising the first low-voltage transistive element, the third high-voltage transistive element, and the fifth low-voltage transistive element; where the fifth low-voltage transistive element is coupled in parallel to the fourth low-voltage transistive element. Other embodiments of this aspect include corresponding systems, apparatus, and computer program products.

Particular embodiments of the subject matter described in this specification can be implemented to realize one or more of the following advantages. The program circuit and related systems and techniques described herein allow high-voltage devices to be used with low-voltage devices in high-voltage applications. In some situations, fabrication using low-voltage devices costs less than fabrication using high-voltage devices. Therefore, replacing high-voltage devices with low-voltage devices decreases a cost of OTP memory that can be used in the high-voltage applications. Use of stepped gate laterally diffused metal oxide semiconductor (LDMOS) in transistors in the program circuit increases the breakdown voltage of the transistors in the off state and minimizes on-resistance (resistance drain-to-source) during transistor conduction, thereby decreasing a response time, i.e., a decreased RC time constant. Increasing the breakdown voltage of the transistors in the program circuit allows the IC to operate at high voltages, reducing or eliminating a need for a separate charge pump or pin, thereby increasing an ease of IC fabrication and further reducing costs. In addition, implementation of OTP memory in a process that uses low-voltage and high-voltage devices leverages available device inventory and reduces a need for dedicated layers, process enhancements, and devices to implement memory functionality.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
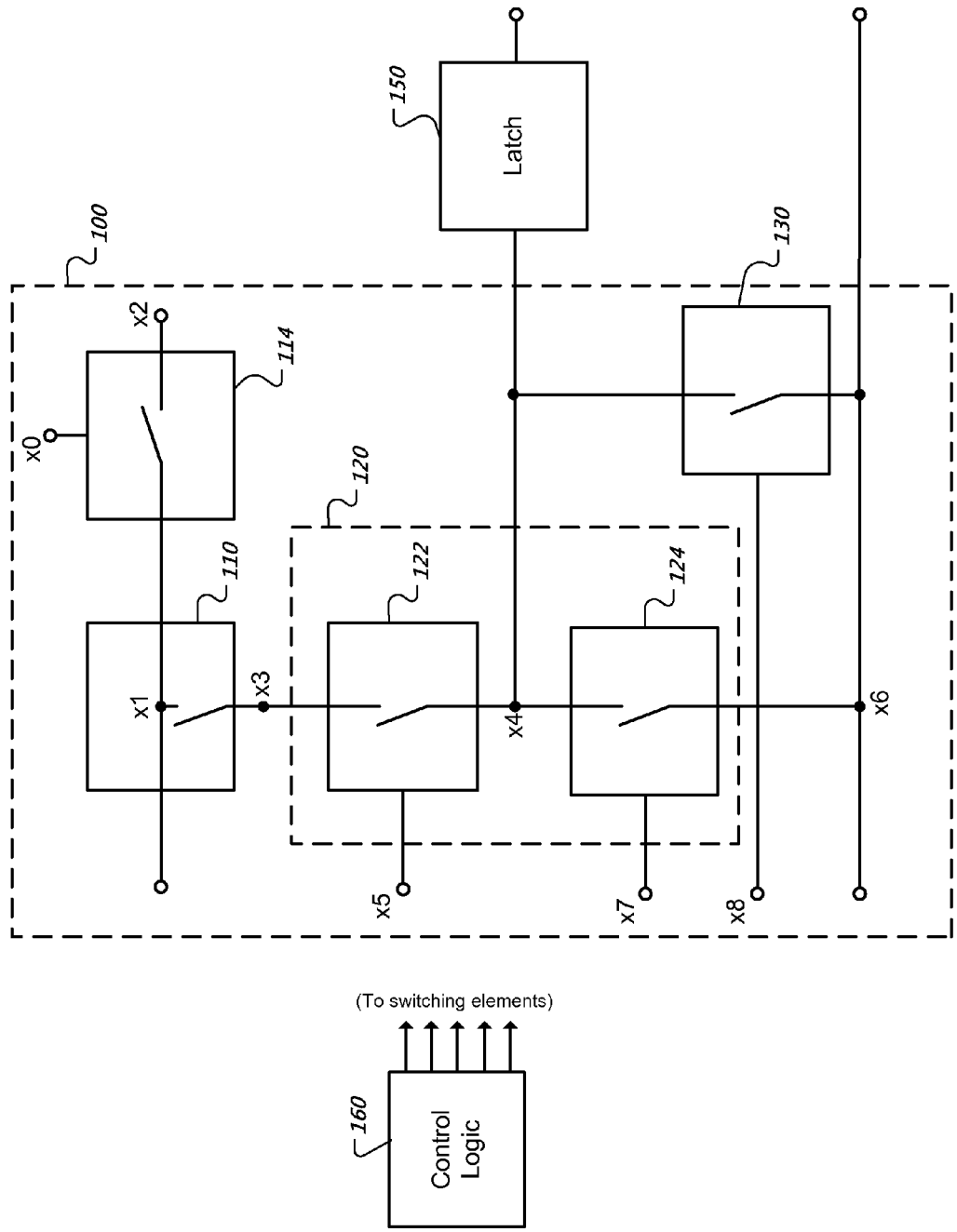
FIG. 1 is a block diagram including an example program circuit.

FIG. 1 is a block diagram including an example program circuit 100. The program circuit 100 includes a first switching element 110, a second switching element 114, a burn subcircuit 120 including a third switching element 122 and a fourth switching element 124, and a fifth switching element 130. The first switching element 110 can be a low-voltage switching element, the second switching element 114 can be a high-voltage switching element, the third switching element 122 can be a high-voltage switching element, the fourth switching element 124 can be a low-voltage switching element, and the fifth switching element 130 can be a low-voltage switching element. A high-voltage switching element is designed to have a greater breakdown voltage than a low-voltage switching element. For example, a high-voltage switching element can be designed with a breakdown voltage greater than 10.0 V, and a lower-voltage switching element can be designed with a breakdown voltage between 3.0 V and 10.0 V.

The program circuit 100 can be coupled to a latch 150, e.g., a latch memory circuit used to store a bit value (0 or 1).

In program circuit 100, the first switching element 110 includes a switch that is coupled between nodes x1 and x3. The second switching element 114 includes a switch that is coupled between nodes x1 and x2, and controlled by an input signal received at node x0. The third switching element 122 includes a switch coupled between nodes x3 and x4, and is controlled by an input signal received at node x5. The fourth switching element 124 includes a switch coupled between nodes x4 and x6, and is controlled by an input signal received at node x7. The fifth switching element 130 includes a switch coupled between nodes x4 and x6 in parallel with the switch of the second switching element 124, and is controlled by an input signal received at node x8. The output of the program circuit 100 is provided to the latch 150 at node x4.

Each of the first switching element 110, second switching element 114, third switching element 122, fourth switching element 124, and fifth switching element 130 can be a semiconductor switching element, e.g., a transistor. In addition, the fourth switching element 124 and the fifth switching element 130 can each have a channel of a same type, i.e., doping, of semiconductor material. Furthermore, the fifth switching element 130 can be a weak switching element and the fourth switching element 124 can be a strong switching element in relation to the fifth switching element 130. The strength of a switching element can be measured by pulldown strength of a device. For example, the strength of a transistor can be determined by the length of a channel underneath a gate of the transistor. As a particular example, the channel length of a weak switching element can be greater than, e.g., six times greater than, the channel length of a strong switching device.

Control logic 160 can be coupled to the program circuit 100 to select a mode of operation of the program circuit 100. By selectively opening and closing the switching elements, the program circuit can be configured to be in a read mode for reading a value from a bit cell, e.g., by transferring the value of the bit cell into the latch 150, or in a program mode (write mode) for writing a value into the bit cell. In the program circuit 100, the first switching element 110 effectively serves as the bit cell to store the value of the bit. In particular, if the first switching element 110 is operating normally, with node x1 (an input node) generally electrically isolated from node x3 (a control node), then the program circuit 100 can be considered to have a first value, e.g., 0. In contrast, if the first switching element 110 has been shorted out, e.g., so that node x1 is permanently electrically coupled to node x3, then the program circuit 100 can be considered to have a different second value, e.g., 1. Since shorting is a non-reversible process, once the first switching element 110 has been shorted out, the value of the bit stored by the program circuit 100 is permanently changed.

When the program circuit 100 is in a program mode, a write operation can be performed, e.g., the value of the bit stored by the program circuit 100 can be changed. In particular, the value of the bit stored by the program circuit 100 can be modified, e.g., changed from 0 to 1. Since the program circuit 100 is a one-time programmable memory, once the value of the bit is changed, it cannot be reset.

Enabling the program mode of the program circuit 100 can include using the control logic 160 to apply a sufficiently high voltage to the first switching element 110 to cause shorting of the first switching element, e.g., a voltage greater than a breakdown voltage of the first switching element 110, such that node x1 becomes electrically coupled to node x3. Shorting the first switching element 110 includes coupling node x1 to a high voltage source, and enabling the third and fourth switching elements 122 and 124 while the fifth switching element 130 remains disabled. As a result, the high voltage applied to the first switching element 110 "blows", and thus, programs the first switching element 110.

When the program circuit is in a read mode, a read operation can be performed. Thus, in the read mode, the value of the bit stored by the program circuit 100 can be read, e.g., by transferring the value to the latch 150 and then reading the output of the latch 150. The program circuit 100 can set the latch 150 in the read mode in the manner described in further detail below. Enabling the read mode of the program circuit 100 can include applying voltage signals at node x2 and x0, while using the control logic 160 to enable, i.e., close, the third switching element 122 and the fifth switching element 130, e.g., by applying signals to the nodes x5 and x8. The fourth switching element 124 remains disabled throughout the duration of the read operation. As an example, a signal of 1.8 V can be applied to the third switching element 122 at node x5, and a signal of 1.8 V can be applied to the fifth switching element 130 at node x8; the program circuit 100 can be operable in the range of 1.4 V to 2.2 V.

Because the fifth switching element 130 is a weak switching element with relatively high impedance, when enabled, the fifth switching element 130 does not pull node x4 all the way to ground. Rather, the fifth switching element 130 creates a voltage divider. As a result, a substantial portion of the voltage applied at node x2 will appear at node x4 and serve as input for the latch circuit 150 during the read operation. The voltage at node x4 is less than the voltage at node x2, but much greater than zero. As examples, a weak switching element can have an impedance greater than 100 kΩ, a strong switching element can have an impedance between 10 kΩ and 100 kΩ, and a blown switching element can have an impedance between 1 kΩ and 10 kΩ.

As a particular example, if the first switching element 110 has been blown, and signals of 1.8 V are applied at each of the nodes x0, x1, x2, x5, and x8, the fifth switching element 130 serves as a weak pulldown to ground, resulting in a voltage of approximately 1.0 V at node x4. The voltage at node x4 is greater than a threshold voltage, e.g., 0.45 V, of a series inverter that can be coupled to the latch 150, resulting in a bit value of 1 at the output of the latch 150.

Figure 2:
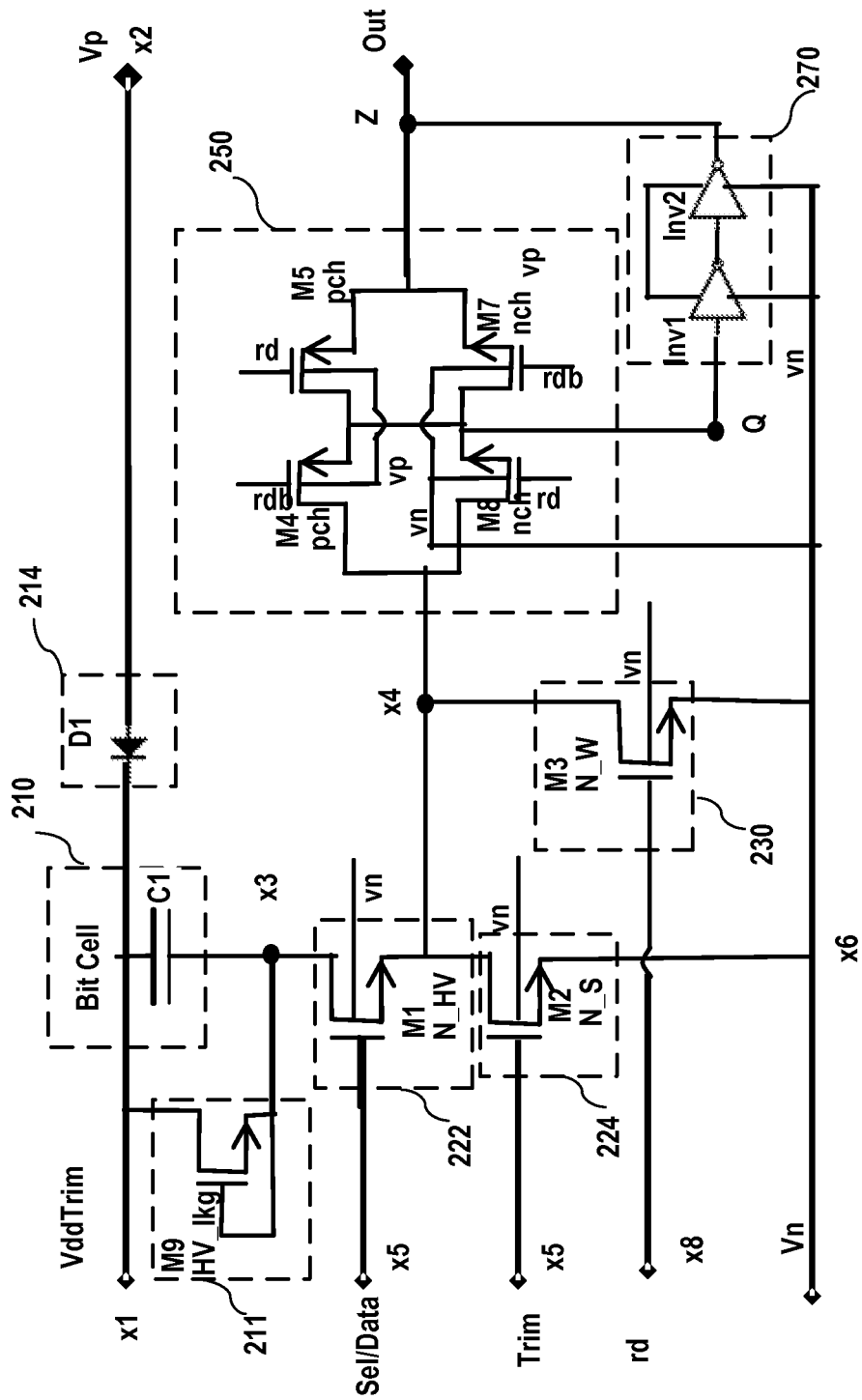
FIG. 2 is a schematic diagram of an example one time programmable (OTP) bit-cell.

FIG. 2 is a schematic diagram of an example one time programmable (OTP) bit-cell. The OTP bit-cell includes a program circuit, e.g., an implementation of the program circuit 100 of FIG. 1. In general, the circuit of FIG. 2 operates in the same fashion as the circuit of FIG. 1, with differences explained below. The program circuit includes a first transistive element 210 (e.g., an example of the first switching element 110 of FIG. 1), a second transistive element 214 (e.g., an example of the second switching element 114 of FIG. 1), a third transistive element 222 (e.g., an example of the third switching element 122 of FIG. 1), a fourth transistive element 224 (e.g., an example of the fourth switching element 124 of FIG. 1), and a fifth transistive element 230 (e.g., an example of the fifth switching element 130 of FIG. 1).

In the example of FIG. 2, the first transistive element 210 is an OTP capacitive element; the second transistive element 214 is a p-channel diode; the third transistive element 222 is a high-voltage n-channel transistor; the fourth transistive element 224 is a strong, low-voltage n-channel transistor; and the fifth transistive element 230 is a weak, low-voltage n-channel transistor. In addition, a high voltage LDMOS device 211 is coupled in parallel with the first transistive element 210 to provide additional leakage path that improves the time dependent dielectric breakdown reliability (TDDB) of the unprogrammed capacitive cells in the first transistive element 210.

Control logic can be coupled to the program circuit of FIG. 2 to select a mode of operation of the program circuit of FIG. 2 so that it operates in a manner as described with respect to FIG. 1. In particular, by selectively enabling and disabling the transistive elements, the program circuit of FIG. 2 can be configured to be in a read mode for reading a value from a first transistive element 210, e.g., by transferring the value of the first transistive element 210 into a latch 250 (e.g., an example of the latch 150 of FIG. 1), or in a program mode (write mode) for writing a value into the first transistive element 210.

In the example of FIG. 2, each of the transistive elements 211 and 222 in the program circuit are high voltage (HV) devices and can be LDMOS transistors. In addition, a uniform gate or a stepped gate structure can be used in the implementation of the HV devices. In the stepped gate LDMOS transistor, a first gate and a second gate are disposed on gate oxide including a first portion and a second portion. The first gate is disposed on the first portion and the second gate is disposed on the second portion. The thickness of the gate oxide in the first portion can be different from the thickness of the gate oxide in the second portion. For example, the thickness of the second portion can be less than the thickness of the first portion.

In some implementations, the thickness of the second portion is less than about 40 Å, e.g., 35 Å, and the thickness of the first portion is greater than about 200 Å. By varying the thickness of the gate oxide, the thinner portion of the gate oxide, e.g., the second portion, can have a lower turn-on voltage, e.g., a voltage that enables the transistor. In addition, the thinner portion of the gate oxide can also have a breakdown voltage that is less than the breakdown voltage of the junctions in the transistor, so that the gate oxide breaks down before the junctions. The stepped gate structure also provides an ability to maximize the breakdown voltage in a transistor's "off" state (disabled) and low Rds(on), i.e., on resistance (resistance drain-to-source). In some implementations, the first transistive element 210 includes both thin oxide and thick oxide portions.

Returning to the program circuit in FIG. 2, in some implementations, a first end of the first transistive element 210, defined by a poly gate, is coupled to node x1, i.e., node VddTrim. A second end of the first transistive element 210 is coupled to the drain of the third transistive element 222. The source of the third transistive element 222 is coupled to the drain of the fourth transistive element 224. The source of the fourth transistive element 224 is coupled to node x6, i.e., node vn, and the gate of the fourth transistive element 224 is coupled to node x7, i.e., node Trim.

The fifth transistive element 230 is coupled in parallel to the fourth transistive element 224. In particular, the drain of the fifth transistive element 230 is coupled to the drain of the fourth transistive element 224, and the source of the fifth transistive element 230 is coupled to the source of the fourth transistive element 224. The gate of the fifth transistive element 230 is coupled to node x8, i.e., node rd, and the source of the fifth transistive element 230 is coupled to node vn.

In some implementations, the OTP-first switching also includes the latch 250 and a series inverter circuit 270. The latch 250 is coupled to the source of the third transistive element 222 and stores a bit value. The series inverter circuit 270 improves the quality and voltage gain of signals received at its input. An input node of the series inverter 270 is coupled to the latch 250, as illustrated in FIG. 2, and an output node of the series inverter 270 is coupled to an output of the latch 250.

As generally described above with reference to FIG. 1, the program circuit can operate in a read mode for reading the bit value in the latch 250 or in a program mode for writing a bit value to the latch 250.

In the read mode, the second transistive element 214 is enabled by setting node vp to high, and node vddTrim can be set to the same value as node vp. The read mode can be in a low voltage domain (e.g., less than about 3.0 V). For example, vp can be about 1.8 V. When vddTrim is set to vp, a voltage at vddTrim is also 1.8 V. A sel/data signal and a read signal are also enabled on node sel/data and node rd, respectively, enabling the fifth transistive element 230 and the third transistive element 222. Note that the sel/data signal and read signal can be low voltage signals because they are electrically coupled to thin gate transistive elements.

Because the fifth transistive element 230 is a weak transistive element, the fifth transistive element 230 provides a weak pulldown and creates as a voltage divider. As a result, the voltage at node x4 will be less than the voltage at node x2, i.e., node vp, but greater than zero.

In the program mode, node vddtrim is connected to a high voltage source, e.g., greater than about 7.0 V), the third transistive element 222 is enabled by applying a voltage signal to sel/data, e.g., 1.8V. A pulsed trim signal is applied to the trim node of the fourth transistive element 224. Because the fourth transistive element 224 is a strong device, the fourth transistive element 224 provides a strong pulldown and pulls the negative node of the first transistive element 210 to a voltage level close to zero. The voltage at node vddTrim will blow the first transistive element 210, resulting in a resistive short between nodes x1 and x3.

Other implementations are possible. In some implementations, the bit-cell, i.e., the first transistive element 210, is coupled to another bit-cell in a multiple-bit OTP block through a high voltage switch.

A leakage device can be coupled in parallel with the first transistive element and configured to enhance time dependent dielectric breakdown reliability (TDDB) reliability of the first transistive element.

While this specification contains many specific implementation details, these should not be construed as limitations on the scope of any implementation or of what may be claimed, but rather as descriptions of features that may be specific to particular embodiments of particular implementations. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the subject matter described in this specification have been described. Other embodiments are within the scope of the following claims.

What is claimed is:

1. A semiconductor device comprising:
   a first low-voltage transistor;
   a second high-voltage transistive element coupled to a first terminal of the first low-voltage transistor;
   a burn subcircuit coupled to the first low-voltage transistor and a latch, the burn subcircuit including a third high-voltage transistor coupled to a fourth low-voltage transistor, where a drain of the third high-voltage transistor is coupled to a second terminal of the first low-voltage transistor, and a drain of the fourth low-voltage transistor is coupled to the latch; and
   a fifth low-voltage transistor coupled in parallel to the fourth low-voltage transistor;
   where control logic coupled to the burn subcircuit enables a voltage divider comprising the first low-voltage transistor, the third high-voltage transistor, and the fifth low-voltage transistor, in a read mode; or enables the third high-voltage transistor and the fourth low-voltage transistor and burns the first low-voltage transistor, in a program mode.

2. The device of claim 1, where one or more of the transistors are stepped gate laterally diffused metal oxide semiconductor (LDMOS) transistors.

3. A program circuit comprising:
   a first transistor;
   a second transistive element coupled to a first end of the first transistor;
   a burn subcircuit, the burn subcircuit including a third transistor coupled to a fourth transistor, where a drain of the third transistor is coupled to a second end of the first transistor, and a source of the third transistor is coupled to a drain of the fourth transistor; and
   a fifth transistor coupled in parallel to the fourth transistor;
   wherein control logic coupled to the first transistor, the burn subcircuit, and the fourth transistor selectively enables the second transistive element, selectively enables the fourth transistor, and selectively enables the fifth transistor to enable a read mode or a program mode.

4. The circuit of claim 3, further comprising:
   a leakage device coupled in parallel with the first transistor and configured to enhance time dependent dielectric breakdown reliability (TDDB) reliability of the first transistor.

5. The circuit of claim 3, where the first transistor is a low-voltage stepped gate capacitor, the second transistive element is a high-voltage diode, the third transistor is a high-voltage stepped gate laterally diffused metal oxide semiconductor (LDMOS) transistor, the fourth transistor is a low-voltage transistor, and the fifth transistor is a low-voltage transistor.

6. The circuit of claim 5, where a breakdown voltage of a gate oxide in the stepped gate LDMOS transistor is less than a breakdown voltage of a junction in the stepped gate LDMOS transistor.

7. The circuit of claim 6, where the gate oxide in the stepped gate LDMOS includes a first portion and a second portion, where a thickness of the second portion is less than a thickness of the first portion.

8. The circuit of claim 7, where the thickness of the second portion is less than about 40 Å.

9. The circuit of claim 8, where the thickness of the first portion is greater than about 200 Å.

10. The circuit of claim 9, where an impedance of the first transistor is between 1 kΩ and 10 kΩ.

11. The circuit of claim 10, where an impedance of the fourth transistor is between 10 kΩ and 100 kΩ.

12. The circuit of claim 3, where the fourth transistor and the fifth transistor each include a channel of a same type of semiconductor material.

13. The circuit of claim 12, where the type of semiconductor material is n-type.

14. The circuit of claim 12, where the fifth transistor is a weak transistor that is configured to create a voltage divider in the read mode.

15. The circuit of claim 3, further comprising:
   a latch coupled to a source of the second transistive element.

* * * * *